(12) United States Patent
Giere et al.

(10) Patent No.: US 11,982,691 B2
(45) Date of Patent: May 14, 2024

(54) MEASURING AN ELECTRICAL VOLTAGE ON A METAL-ENCAPSULATED SWITCHGEAR

(71) Applicant: Siemens Energy Global GmbH & Co. KG, Munich (DE)

(72) Inventors: Stefan Giere, Brandenburg (DE); Thomas Heinz, Berlin (DE); Thomas Hilker, Stahnsdorf (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 119 days.

(21) Appl. No.: 17/633,654

(22) PCT Filed: Jul. 10, 2020

(86) PCT No.: PCT/EP2020/069487
§ 371 (c)(1),
(2) Date: Feb. 8, 2022

(87) PCT Pub. No.: WO2021/023471
PCT Pub. Date: Feb. 11, 2021

(65) Prior Publication Data
US 2022/0317159 A1    Oct. 6, 2022

(30) Foreign Application Priority Data
Aug. 8, 2019 (DE) ............... 10 2019 211 950.6

(51) Int. Cl.
*G01R 15/18* (2006.01)
*H02B 13/035* (2006.01)

(52) U.S. Cl.
CPC ....... *G01R 15/181* (2013.01); *H02B 13/0356* (2013.01)

(58) Field of Classification Search
CPC ........ G01R 15/181; G01R 1/18; G01R 15/06; G01R 15/16; G01R 19/0084; G01R 1/0416; H02B 13/0356; H01H 33/027
See application file for complete search history.

(56) References Cited

U.S. PATENT DOCUMENTS

| 3,988,684 | A | 10/1976 | Mueller et al. |
| 9,671,260 | B2 | 6/2017 | Isik-Uppenkamp |
| 9,759,755 | B2 | 9/2017 | De Rybel et al. |
| 11,047,882 | B2 | 6/2021 | Kato et al. |

(Continued)

FOREIGN PATENT DOCUMENTS

| CN | 103718049 A | 4/2014 |
| DE | 4125856 C1 | 9/1992 |

(Continued)

*Primary Examiner* — Farhana A Hoque
(74) *Attorney, Agent, or Firm* — Laurence A. Greenberg; Werner H. Stemer; Ralph E. Locher (57) ABSTRACT

A measuring apparatus for measuring an electrical voltage for a metal-encapsulated switchgear. The measuring apparatus has an electrical conductor, an electrically conductive measuring electrode, which surrounds a first conductor portion of the electrical conductor and is electrically insulated from the electrical conductor, and an electrically conductive field control electrode, which is electrically insulated from the electrical conductor and from the measuring electrode and which has a first field control electrode portion that surrounds the measuring electrode.

13 Claims, 5 Drawing Sheets

(56) References Cited

U.S. PATENT DOCUMENTS

| | | | |
|---|---|---|---|
| 2005/0135028 A1* | 6/2005 | Kato | ................. H02B 13/0356 361/64 |
| 2011/0148393 A1 | 6/2011 | De Buda | |
| 2014/0021965 A1 | 1/2014 | De Rybel et al. | |

FOREIGN PATENT DOCUMENTS

| | | |
|---|---|---|
| DE | 19855528 A1 | 6/2000 |
| EP | 0017953 A1 | 10/1980 |
| EP | 1261091 A1 | 11/2002 |
| EP | 2689256 A1 | 1/2014 |
| EP | 2990811 A1 | 3/2016 |
| EP | 3276363 A1 | 1/2018 |
| EP | 3002594 B1 | 6/2019 |
| TW | 471204 B | 1/2002 |
| WO | WO 2014082903 A1 | 6/2014 |
| WO | 2018020043 A1 | 2/2018 |
| WO | WO 2018092188 A1 | 5/2018 |

* cited by examiner

MEASURING AN ELECTRICAL VOLTAGE ON A METAL-ENCAPSULATED SWITCHGEAR

SPECIFICATION

Field and Background of the Invention

The invention relates to a measuring apparatus and a method for measuring an electrical voltage for a metal-encapsulated switchgear.

A metal-encapsulated switchgear refers to a switchgear that comprises a metal housing which is usually grounded. Switchgears of this type are, for example, power switches and circuit breakers of what are known as the dead tank type and/or switchgears designed with gas insulation. A switchgear of this type usually comprises a voltage converter for measuring and monitoring voltages of the switchgear. In the case, in particular, of a switchgear designed as a high-voltage switch, the voltage is frequently measured via a capacitive coupling between a primary conductor carrying the voltage and a measuring electrode using the principle of a field probe. The measuring electrode is arranged for this purpose in the immediate neighborhood of the primary conductor. The measuring electrode is, for example, arranged in the housing of the switchgear, or in an additional flange ring that runs around the primary conductor.

Summary of the Invention

The invention is based on the object of providing an improved measuring apparatus and an improved method for measuring an electrical voltage for a metal-encapsulated switchgear.

The object is achieved according to the invention by a measuring apparatus with the features as claimed, a method with the features as claimed, and a switchgear with the features as claimed.

Advantageous embodiments of the invention are the subject matter of the subsidiary claims.

A measuring apparatus according to the invention for measuring an electrical voltage for a metal-encapsulated switchgear comprises an electrical conductor, an electrically conductive measuring electrode that surrounds a first conductor portion of the electrical conductor and is electrically insulated from the electrical conductor, and an electrically conductive field control electrode that is electrically insulated from the electrical conductor and the measuring electrode and comprises a first field control electrode portion that surrounds the measuring electrode.

The measuring electrode and the electrical conductor form a capacitor for capacitive acquisition of an electrical voltage that is present at the electrical conductor with respect to a reference potential and by means of which a voltage present at the measuring electrode with respect to the reference potential can be measured. The measuring electrode is arranged here inside the field control electrode. The measuring electrode and the field control electrode are thus advantageously designed in a space-saving manner when compared with a design in which the measuring electrode is arranged outside the field control electrode, since, when the measuring electrode is arranged outside the field control electrode, the measuring electrode and the field control electrode have to be arranged one after the other along the electrical conductor since, as a result of the screening effect of the field control electrode, an arrangement of the measuring electrode, for example around the field control electrode, is not possible. The measuring electrode can, moreover, be installed inside the field control electrode without additional components being needed for fastening it outside the field control electrode.

In one embodiment of the measuring apparatus, the field control electrode comprises a second field control electrode portion that surrounds a second conductor portion of the electrical conductor and has a smaller maximum diameter in a plane perpendicular to the electrical conductor than the first field control electrode portion. In other words, the field control electrode is made wider in the region of the first field control electrode portion than in the second field control electrode portion, in order to be able to accommodate advantageously the measuring electrode in the first field control electrode portion.

In a further embodiment of the measuring apparatus, the measuring electrode has a U-shaped profile with two legs that face away from the electrical conductor. The two legs can, in particular, comprise leg end regions that are bent over in order to avoid high electrical field strengths between the leg end regions and the field control electrode.

In a further embodiment of the measuring apparatus, the field control electrode consists of field control electrode segments that are arranged one after another along a path extending around the electrical conductor. Material for the manufacture of the field control electrode can in this way be saved. Furthermore, for example, cables for contacting the measuring electrode can be routed through between the field control electrode segments.

In a further embodiment of the measuring apparatus, the measuring electrode consists of measuring electrode segments that are arranged one after another along a path extending around the electrical conductor. Material for the manufacture of the measuring electrode can in this way be saved. Furthermore, for example, measurement voltages present at different measuring electrode segments can be measured and averaged to ascertain the voltage present at the electrical conductor.

A further embodiment of the measuring apparatus comprises a measuring coil which is surrounded by the field control electrode, is electrically insulated from the field control electrode, the electrical conductor and the measuring electrode, and extends around the electrical conductor. The measuring coil is, for example, designed as a Rogowski coil. The measuring coil is arranged, for example, between the measuring electrode and the field control electrode, or the measuring electrode and the measuring coil are arranged one after another along the electrical conductor. The measuring coil makes it possible to also measure a current flowing in the electrical conductor in addition to the voltage present at the electrical conductor, in that an induction voltage induced in the measuring coil is measured. The arrangement of the measuring coil inside the field control electrode advantageously enables a compact, space-saving embodiment of the measuring apparatus with the measuring coil.

In the method according to the invention for measuring an electrical voltage that is present at the electrical conductor of a measuring apparatus as claimed in one of the preceding claims with respect to a reference potential, a measurement voltage is measured that is present at the measuring electrode of the measuring apparatus with respect to the reference potential, and the voltage present at the electrical conductor of the measuring apparatus with respect to the reference potential is ascertained from the measurement voltage. The method according to the invention exploits the fact that the measurement voltage present at the measuring electrode is proportional to the voltage present at the electrical conductor (with respect to the reference potential in both cases).

A metal-encapsulated switchgear according to the invention for interrupting and closing an electrical current path, for example a power switch or a circuit breaker, comprises a measuring apparatus according to the invention, wherein the current path passes through the electrical conductor of the measuring apparatus. The advantages of a switchgear according to the invention emerge from the advantages referred to above of a measuring apparatus according to the invention.

One embodiment of a switchgear according to the invention provides that the field control electrode of the measuring apparatus is placed at a ground potential. In this way the possibility that the field control electrode adopts an unwanted electrical potential is advantageously avoided.

One embodiment of a switchgear according to the invention comprises a metal housing and a bushing in the housing, wherein the electrical conductor of the measuring apparatus extends through the bushing, and the field control electrode is arranged in the bushing. The arrangement of the field control electrode, and thereby also of the measuring electrode, in a bushing in the housing of the switchgear has the advantage, in comparison with an arrangement in the housing, that the housing does not have to have any space for the field control electrode, and can therefore be embodied in a more compact form.

The properties, features and advantages of this invention described above, as well as the manner in which these are achieved, will become clearer and more easily understandable in connection with the following description of exemplary embodiments that are explained more closely in connection with the drawings. In these:

Parts that correspond to one another are given the same reference signs in the figures.

DETAILED DESCRIPTION OF THE INVENTION

Figure 1:
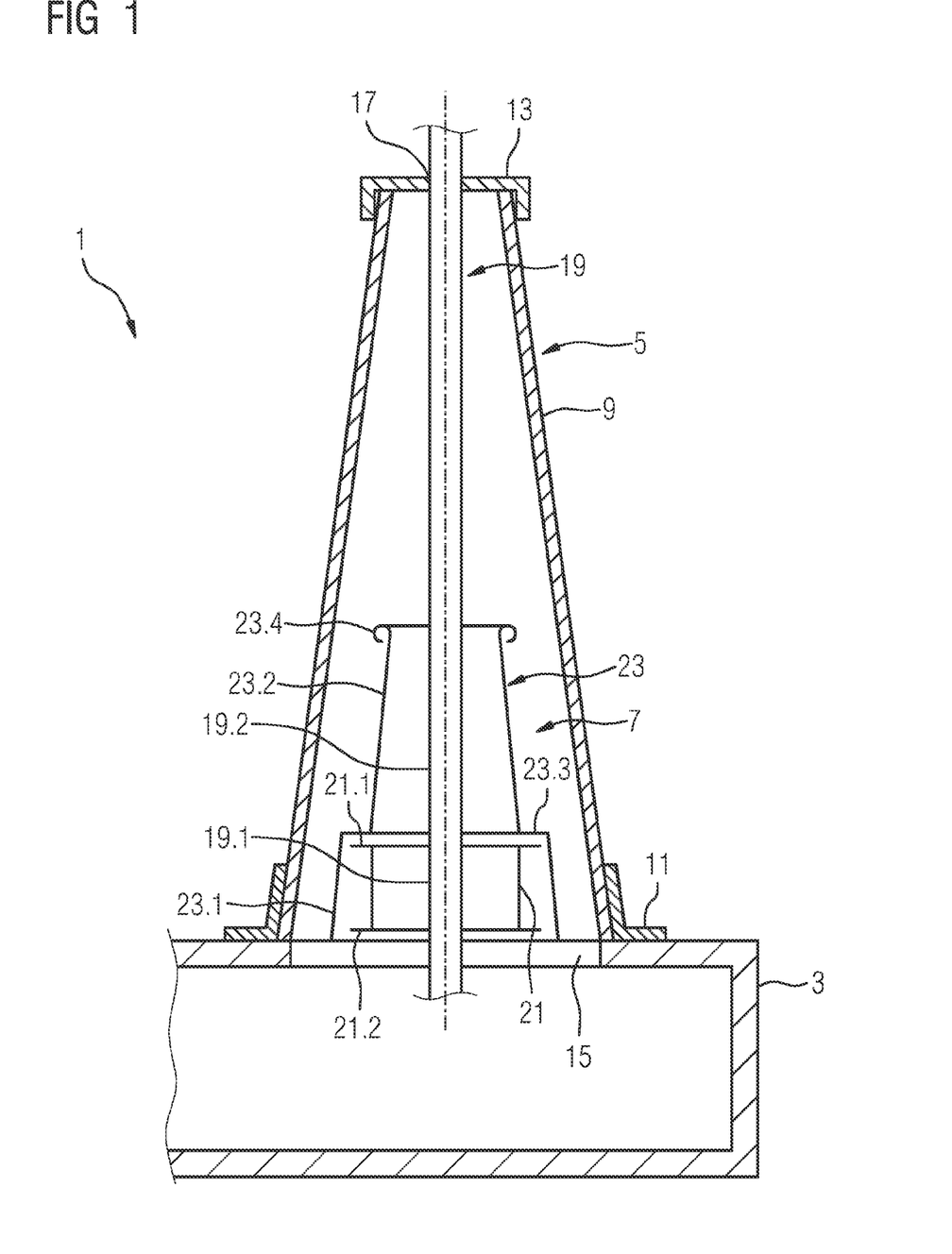
FIG. 1 shows a sectional view of an exemplary embodiment of a switchgear.

FIG. 1 shows a sectional view of an exemplary embodiment of a metal-encapsulated switchgear 1 according to the invention for interrupting and closing an electrical current path. The switchgear 1 is, for example, a power switch or a circuit breaker. The switchgear 1 comprises a metal housing 3, a bushing 5 in the housing 3 and a first exemplary embodiment of a measuring apparatus 7 for measuring an electrical voltage. The switchgear 1 is only illustrated in the region of the bushing 5, since only this region is relevant to the invention.

The bushing 5 comprises a funnel-shaped insulator 9, a flange 11 and a cover 13. The insulator 9 is manufactured from an electrically insulating material, extends away from a housing opening 15 of the housing 3, has an external surface with the shape of a truncated cone, and tapers increasingly as the distance from the housing opening 15 increases. The flange 11 extends at the housing 3 in the shape of a ring around a housing-side end of the insulator 9, and fixes the insulator 9 to the housing 3. The cover 13 closes an end of the insulator 9 that faces away from the housing 3 apart from a cover opening 17.

Figure 2:
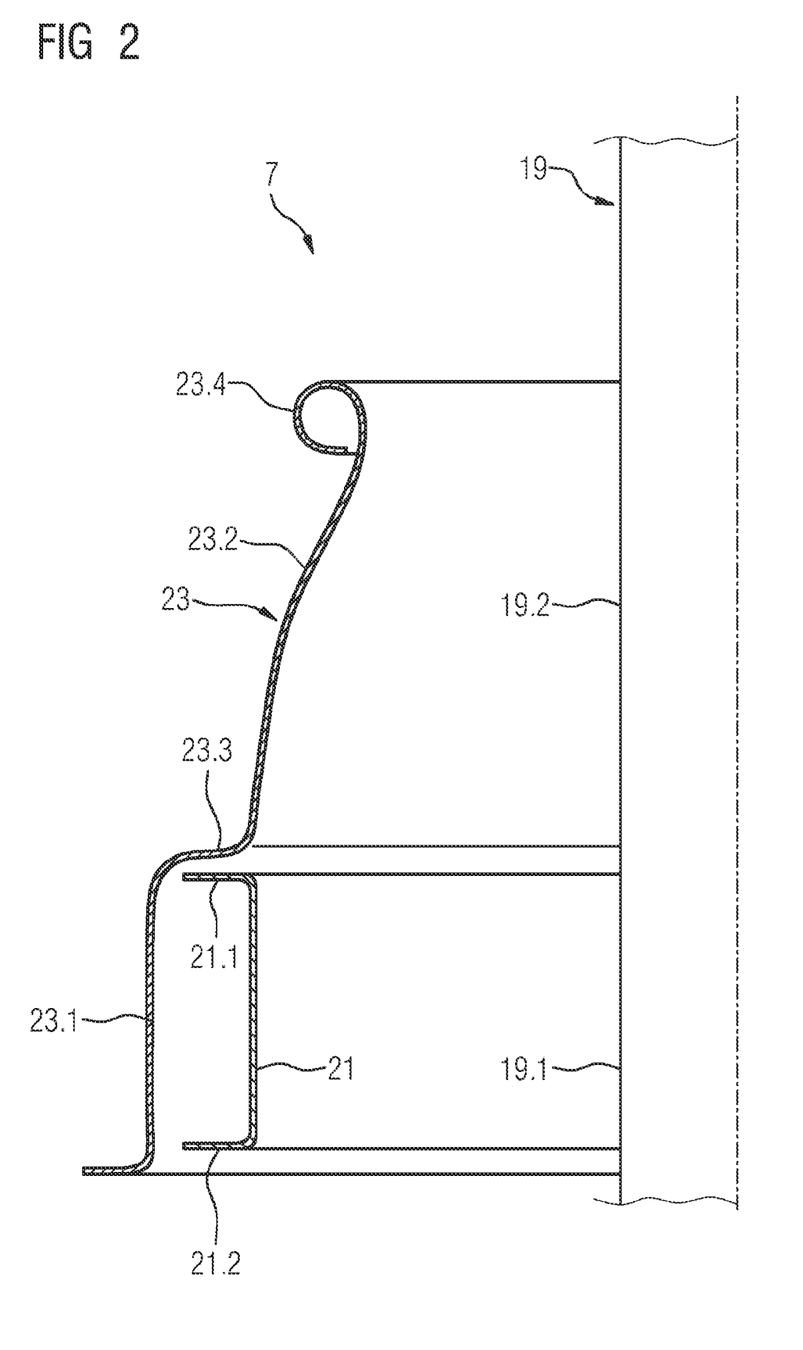
FIG. 2 shows a sectional view of a first exemplary embodiment of a measuring apparatus for measuring an electrical voltage.

FIG. 2 shows an enlarged sectional view of the measuring apparatus 7 of the switchgear 1 illustrated in FIG. 1. The measuring apparatus 7 comprises an electrical conductor 19, an electrically conductive measuring electrode 21, and an electrically conductive field control electrode 23. The electrical conductor 19, the measuring electrode 21 and the field control electrode 23 are electrically insulated from one another.

The electrical conductor 19 extends through the cover opening 17 into the bushing 5 and through the bushing 5 into the housing 3, and is part of the current path that is interrupted and closed by the switchgear 1.

The measuring electrode 21 surrounds a first conductor portion 19.1 of the electrical conductor 19 like a ring. The measuring electrode 21 comprises a U-shaped profile with two legs 21.1, 21.2 facing away from the electrical conductor 19.

The field control electrode 23 has the form of a funnel. A first field control electrode portion 23.1 of the field control electrode 23 surrounds the measuring electrode 21. A second field control electrode portion 23.2 of the field control electrode 23 surrounds a second conductor portion 19.2 of the electrical conductor 19 that is adjacent to the first conductor portion 19.1. Between the first field control electrode portion 23.1 and the second field control electrode portion 23.2, the field control electrode 23 comprises a step-like transition region 23.3 in which its diameter in a plane perpendicular to the electrical conductor 19 falls from the first field control electrode portion 23.1 to the second field control electrode portion 23.2. The second field control electrode portion 23.2 tapers increasingly as the distance from the first field control electrode portion 23.1 increases, up to an end region 23.4 of the field control electrode 23 that is formed bent over away from the electrical conductor 19.

In operation of the switchgear 1, the field control electrode 23 and the housing 3 are placed at a ground potential. The measuring electrode 21 and the electrical conductor 19 form a cylindrical capacitor, with which an electrical voltage that is present at the electrical conductor 19 with respect to a reference potential is measured capacitively. For this purpose, a measurement voltage that is present at the measuring electrode 21 with respect to the reference potential is measured, and the voltage present at the electrical conductor 19 with respect to the reference potential is ascertained from the measurement voltage. The measurement voltage is, for example, accessed at a cable (not illustrated) that is electrically connected to the measuring electrode 21 and is passed in an electrically insulated manner through the field control electrode 23 or out of the field control electrode 23.

The exemplary embodiment of a switchgear 1 shown in FIG. 1 can be modified in various ways. In particular, the switchgear 1 can comprise a measuring apparatus 7 shown below in FIG. 3 or FIG. 4 instead of the measuring apparatus 7 shown in FIG. 2. The measuring electrode 21 and the field control electrode 23 can, furthermore, be arranged in the housing 3 instead of in the bushing 5.

Figure 3:
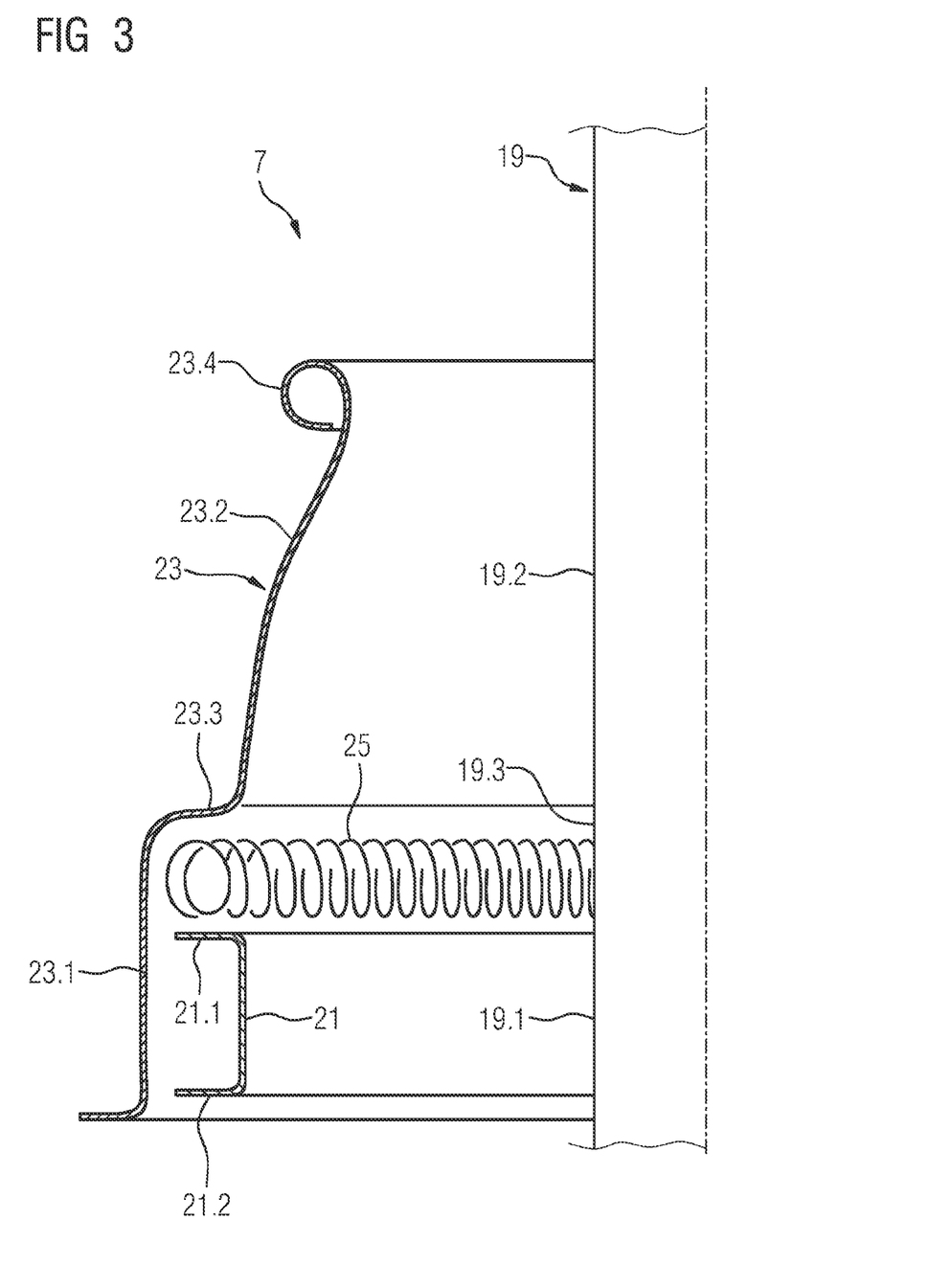
FIG. 3 shows a sectional view of a second exemplary embodiment of a measuring apparatus for measuring an electrical voltage.

FIG. 3 shows a sectional view of a second exemplary embodiment of a measuring apparatus 7 according to the invention. This exemplary embodiment differs from the exemplary embodiment shown in FIGS. 1 and 2 principally in that in addition to the electrical conductor 19, the measuring electrode 21 and the field control electrode 23, it comprises a measuring coil 25 that extends like a ring around a third conductor portion 19.3 between the first conductor portion 19.1 and the second conductor portion 19.2 of the electrical conductor 19 and, together with the measuring electrode 21, is surrounded by the first field control electrode portion 23.1. The measuring coil 25 is designed as a Rogowski coil, and is electrically insulated from the electrical conductor 19, the measuring electrode 21 and the field control electrode 23. An electrical current that flows in the electrical conductor 19 is measured with the measuring coil 25. An induction voltage induced in the measuring coil 25 is measured for this purpose, and the current flowing in the electrical conductor 19 is ascertained from the induction voltage. For example, the induction voltage is accessed between cables (not illustrated) that are electrically connected to the measuring electrode 21 and are passed in an electrically insulated manner through the field control electrode 23 or out of the field control electrode 23.

Figure 4:
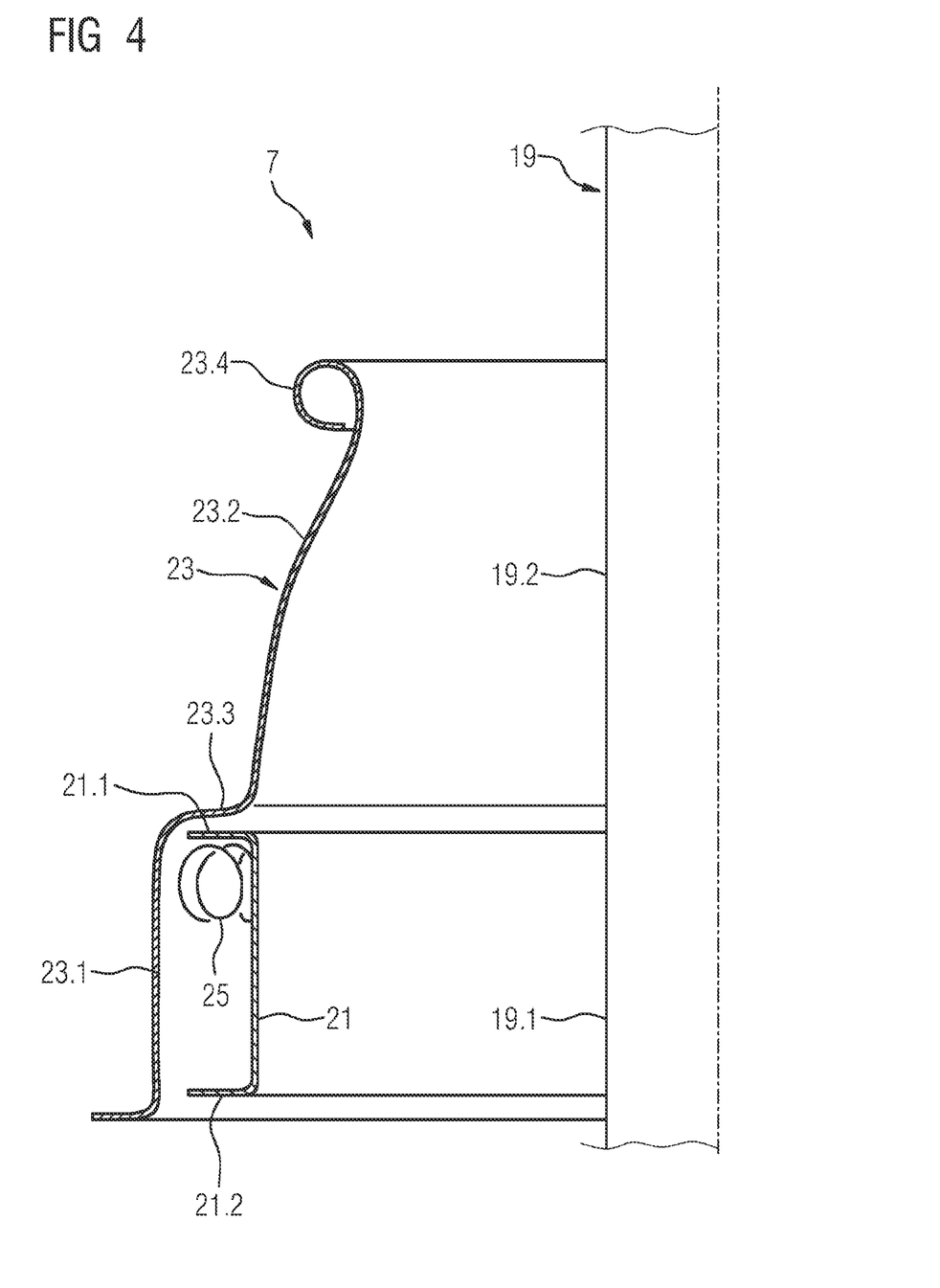
FIG. 4 shows a sectional view of a third exemplary embodiment of a measuring apparatus for measuring an electrical voltage.

FIG. 4 shows a sectional view of a third exemplary embodiment of a measuring apparatus 7 according to the invention. This exemplary embodiment differs from the exemplary embodiment shown in FIG. 3 principally in that the measuring coil 25 is arranged between the measuring electrode 21 and the field control electrode 23 and the two legs 21.1 and 21.2 of the measuring electrode 21.

Figure 5:
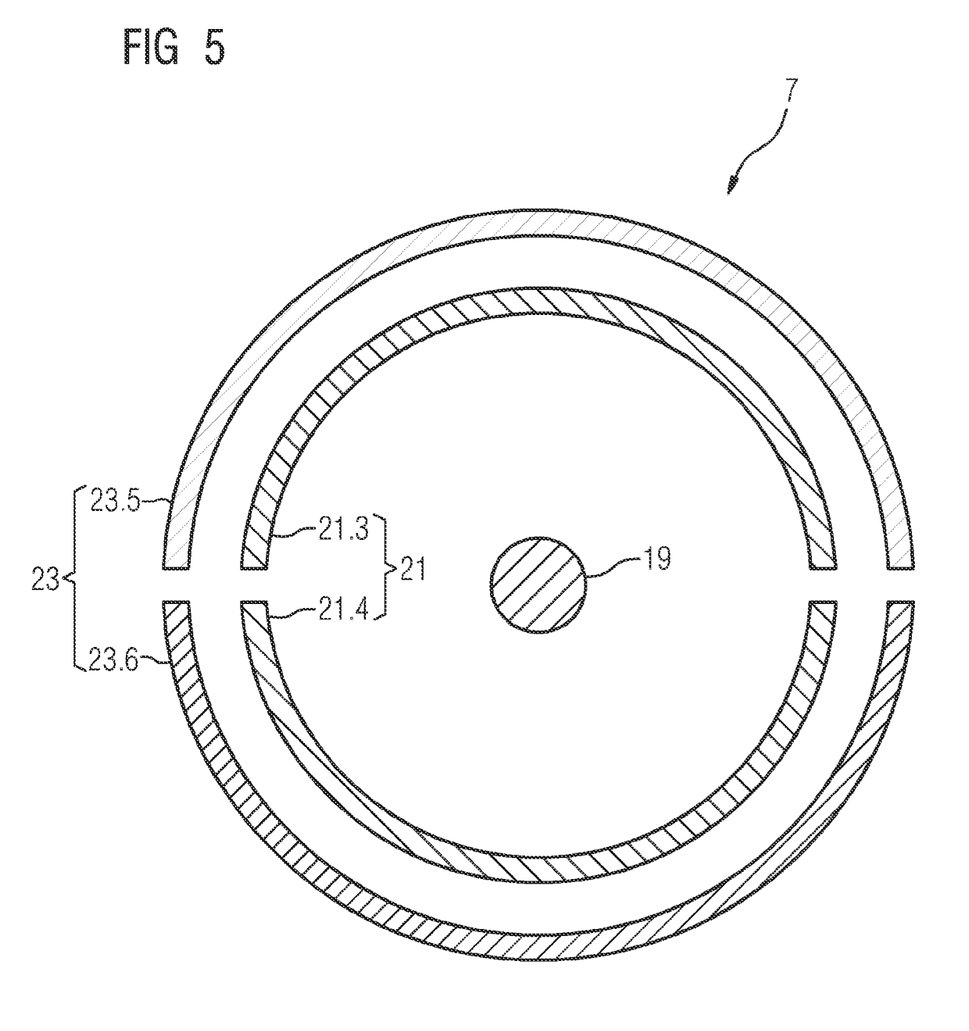
FIG. 5 shows a sectional view of a fourth exemplary embodiment of a measuring apparatus for measuring an electrical voltage.

FIG. 5 shows a fourth exemplary embodiment of a measuring apparatus 7 according to the invention, in a sectional view with a cut plane perpendicular to the electrical conductor 19. In this exemplary embodiment, the field control electrode 23 consists of two field control electrode segments 23.5, 23.6 arranged along a path extending around the electrical conductor 19 behind one another and spaced apart from one another, and the measuring electrode 21 consists of two measuring electrode segments 21.3, 21.4 arranged along a path extending around the electrical conductor 19 behind one another and spaced apart from one another. Apart from the segmented embodiment of the field control electrode 23 and of the measuring electrode 21, the measuring apparatus 7 can be designed as in one of FIGS. 2 to 4.

The exemplary embodiments shown in FIGS. 2 to 5 of measuring apparatuses 7 can be further developed in various ways. For example, the measuring electrode 21 can be fully or partially embedded in a casting compound, for example in epoxy resin, and bonded through the casting compound to the field control electrode 23 without, however, being electrically connected to the field control electrode 23. In the exemplary embodiments shown in FIGS. 3 and 4, moreover, the measuring coil 25 can be fully or partially embedded in a casting compound, for example in epoxy resin, and bonded through the casting compound to the field control electrode 23 and/or the measuring electrode 21, without, however, being electrically connected to the field control electrode 23 or the measuring electrode 21. The measuring electrode 21 can furthermore, for example, be designed as an electrically conductive foil. The field control electrode 23 and/or the measuring electrode 21 can, furthermore, have window-like openings. The exemplary embodiment shown in FIG. 5 can, for example, be modified in that the field control electrode 23 comprises more than two field control electrode segments 23.5, 23.6 and/or the measuring electrode 21 comprises more than two measuring electrode segments 21.3, 21.4.

Although the invention has been illustrated and described in more detail through preferred exemplary embodiments, the invention is not restricted by the disclosed examples, and other variations can be derived from these by someone skilled in the art without leaving the protective scope of the invention.

The invention claimed is:

1. A measuring apparatus for measuring an electrical voltage for a metal-encapsulated switchgear, the measuring apparatus comprising:
   an electrical conductor;
   an electrically conductive measuring electrode that surrounds a conductor portion of the electrical conductor and is electrically insulated from said electrical conductor; and
   an electrically conductive field control electrode that is electrically insulated from said electrical conductor and from said measuring electrode;
   said field control electrode having a field control electrode portion that surrounds said measuring electrode;
   wherein said conductor portion of said electrical conductor is a first conductor portion and said field control electrode portion of said field control electrode that surrounds said measuring electrode is a first field control electrode portion;
   said field control electrode further comprising a second field control electrode portion that surrounds a second conductor portion of said electrical conductor; and
   said second field control electrode portion having a maximum diameter in a plane perpendicular to said electrical conductor that is smaller than a diameter of said first field control electrode portion.

2. The measuring apparatus according to claim 1, wherein said measuring electrode has a U-shaped profile with two legs that face away from said electrical conductor.

3. The measuring apparatus according to claim 1, wherein said field control electrode is formed of field control electrode segments that are arranged one after another along a path extending around said electrical conductor.

4. The measuring apparatus according to claim 1, wherein said measuring electrode is formed of measuring electrode segments that are arranged one after another along a path extending around said electrical conductor.

5. The measuring apparatus according to claim 1, further comprising a measuring coil for current measurement surrounded by said field control electrode and extending around said electrical conductor, wherein said measuring coil is electrically insulated from said field control electrode, from said electrical conductor, and from said measuring electrode.

6. The measuring apparatus according to claim 5, wherein said measuring coil is a Rogowski coil.

7. The measuring apparatus according to claim 5, wherein said measuring coil is arranged between said measuring electrode and said field control electrode.

8. The measuring apparatus according to claim 5, wherein said measuring electrode and said measuring coil are arranged one after another along said electrical conductor.

9. A method of measuring an electrical voltage, the method comprising:
   providing a measuring apparatus configured for measuring the electrical voltage at an electrical conductor with respect to a reference potential;
   the measuring apparatus comprising:
      the electrical conductor;

an electrically conductive measuring electrode that surrounds a conductor portion of the electrical conductor and is electrically insulated from said electrical conductor; and an electrically conductive field control electrode that is electrically insulated from said electrical conductor and from said measuring electrode;

said field control electrode having a field control electrode portion that surrounds said measuring electrode;

measuring a measurement voltage that is present at the measuring electrode of the measuring apparatus with respect to the reference potential; and ascertaining the voltage present at the electrical conductor of the measuring apparatus with respect to the reference potential from the measurement voltage.

10. A metal-encapsulated switchgear for selectively interrupting and closing an electrical current path, comprising:

a measuring apparatus according to claim 1;

wherein the electrical current path passes through the electrical conductor of said measuring apparatus.

11. The switchgear according to claim 10, wherein the field control electrode of the measuring apparatus is at a ground potential.

12. The switchgear according to claim 10, further comprising a metal housing and a bushing in said housing, wherein the electrical conductor of the measuring apparatus extends through said bushing and the field control electrode is arranged in said bushing.

13. The switchgear according to claim 10 being a power switch or a circuit breaker.

\* \* \* \* \*